US009177085B2

(12) United States Patent
Snyder et al.

(10) Patent No.: US 9,177,085 B2
(45) Date of Patent: Nov. 3, 2015

(54) INTEGRATED ASSEMBLAGE OF 3D BUILDING MODELS AND 2D CONSTRUCTION DRAWINGS

(71) Applicant: Bentley Systems, Incorporated, Exton, PA (US)

(72) Inventors: Rob Snyder, Lexington, KY (US); John Frampton, Glenmore, PA (US); Sunand Sandurkar, Pune (IN); Raymond B. Bentley, Elverson, PA (US)

(73) Assignee: Bentley Systems, Incorporated, Exton, PA (US)

( * ) Notice: Subject to any disclaimer, the term of this patent is extended or adjusted under 35 U.S.C. 154(b) by 0 days.

(21) Appl. No.: 14/179,936

(22) Filed: Feb. 13, 2014

(65) Prior Publication Data

US 2014/0163931 A1    Jun. 12, 2014

Related U.S. Application Data

(63) Continuation of application No. 12/652,411, filed on Jan. 5, 2010.

(51) Int. Cl.
*G09G 5/00* (2006.01)
*G06F 17/50* (2006.01)
(Continued)

(52) U.S. Cl.
CPC .......... *G06F 17/5004* (2013.01); *G06F 3/0482* (2013.01); *G06F 3/0488* (2013.01); *G06T 19/00* (2013.01); *G06T 2219/004* (2013.01)
USPC ............................................... 345/621; 703/1

(58) Field of Classification Search
CPC ..... G06T 15/30; G06T 19/006; G06T 11/206; G06T 15/04; G06T 15/506; G06T 19/00; G06T 1/00; G06T 1/0007; G06T 2200/08; G06T 2207/20012; G06T 2207/20016; G06T 2207/20036; G06T 2207/20092; G06T 2207/20136; G06T 17/00; G06T 19/20; G06T 7/0012; G06T 13/80; G06T 17/10; G06T 19/003; G06T 11/003; G06T 11/006; G06T 11/008; G06T 15/00; G06T 15/06; G06T 15/20; G06T 15/80; G06T 17/05; G06T 15/10; G06T 17/005; G06F 2217/04; G06F 2217/02; G06F 17/5004; G06F 17/50; G06F 3/0482; G06F 3/016; G06F 3/041; G06F 3/04842; G06F 17/5081
USPC ............................................... 345/621; 703/1
See application file for complete search history.

(56) References Cited

U.S. PATENT DOCUMENTS 5,815,154 A    9/1998    Hirschtick et al.
(Continued)

FOREIGN PATENT DOCUMENTS

WO    WO-2007/084647 A2    7/2007

OTHER PUBLICATIONS

Bazargan, Kaveh, et al., "Specifying the Representation of Non-geometric Information in 3D Virtual Environments," Proceedings of the 13th International Conference on Human-Computer Interaction. Part II: Novel Interaction Methods and Techniques, Julie A. Jacko (ed.), Springer-Verlag, Berlin, Heidelberg, 2009, pp. 773-782.

(Continued)

*Primary Examiner* — Kee M Tung
*Assistant Examiner* — Yuehan Wang
(74) *Attorney, Agent, or Firm* — Cesari and McKenna, LLP

(57) ABSTRACT

In one embodiment, a viewer executing on an electronic device having a touch sensitive display shows a three-dimensional (3D) model of a building created using computer aided design (CAD) software. A plurality of selectable interface nodes are provided at respective locations within the 3D model. Each interface node is linked to at least one corresponding two-dimensional (2D) construction drawing that shows a section view, a plan view, an elevation view or a detail view of the building related to the location of the interface node. In response to receiving input from a user indicating selection of a particular interface node, a menu is displayed with one or more selectable menu options. In response to receiving additional input from the user indicating selection of a particular menu option, a corresponding 2D construction drawing for the particular interface node is displayed in context of the 3D model of the building.

25 Claims, 7 Drawing Sheets

(51) Int. Cl.
*G06F 3/0482* (2013.01)
*G06T 19/00* (2011.01)
*G06F 3/0488* (2013.01)

(56) References Cited

U.S. PATENT DOCUMENTS

| | | | |
|---|---|---|---|
| 5,982,378 | A | 11/1999 | Kato |
| 6,115,025 | A | 9/2000 | Buxton et al. |
| 7,010,472 | B1 | 3/2006 | Vasey-Glandon et al. |
| 7,016,747 | B1 * | 3/2006 | Ninomiya .................. 700/97 |
| 7,225,115 | B2 * | 5/2007 | Jones ........................ 703/7 |
| 7,280,949 | B2 | 10/2007 | Kano et al. |
| 8,026,929 | B2 | 9/2011 | Naimark |
| 8,036,441 | B2 | 10/2011 | Frank et al. |
| 8,199,166 | B2 * | 6/2012 | Repin et al. ............. 345/633 |
| 8,264,504 | B2 | 9/2012 | Naimark |
| 8,265,915 | B2 | 9/2012 | Hsu et al. |
| 8,370,116 | B2 | 2/2013 | Kindera et al. |
| 8,423,337 | B2 | 4/2013 | Hsu et al. |
| 2001/0047251 | A1 * | 11/2001 | Kemp ........................ 703/1 |
| 2003/0025694 | A1 | 2/2003 | Davis |
| 2003/0052877 | A1 | 3/2003 | Schwegle, Jr. et al. |
| 2003/0071810 | A1 | 4/2003 | Shoov et al. |
| 2006/0061595 | A1 | 3/2006 | Goede et al. |
| 2006/0094951 | A1 * | 5/2006 | Dean et al. ............... 600/407 |
| 2006/0200312 | A1 | 9/2006 | Osaka |
| 2007/0035511 | A1 | 2/2007 | Banerjee et al. |
| 2007/0110338 | A1 | 5/2007 | Snavely et al. |
| 2009/0213116 | A1 | 8/2009 | Konev et al. |
| 2009/0216438 | A1 * | 8/2009 | Shafer ....................... 701/210 |
| 2010/0283788 | A1 | 11/2010 | Rothnemer et al. |

OTHER PUBLICATIONS

Boujut, Jean-Francois, et al., "Design of a 3D Annotation Tool for Supporting Evaluation Activities in Engineering Design," 2005, pp. 1-9.

Engelson, Vadim, et al., "Mechanical CAD with Multibody Dynamic Analysis Based on Modelica Simulation," Proceedings of the 44th Scandinavian Conference on Simulation and Modeling (SIMS'2003), 2003, pp. 1-6.

Gotzelmann, Timo, et al., "Annotation of Animated 3D Objects," 2007, pp. 1-14.

Polys, Nicholas Fearing, "Display Techniques in Information-Rich Virtual Environments," Dissertation Submitted to the Faculty of the Virginia Polytechnic Institute and State University, Blacksburg, Virginia, Jun. 2, 2002, pp. 1-172.

Ritter, Felix, et al., "Illustrative Shadows: Integrating 3D and 2D Information Displays," IUI', ACM, Jan. 12-15, 2003, pp. 166-173.

Stein, Thierry, et al., "Dynamic Label Placement for Improved Interactive Exploration," Proceeding NPAR '08 Proceedings of the 6th international symposium on Non-photorealistic animation and rendering, ACM, 2008, pp. 15-21.

U.S. Appl. No. 12/652,411, Filed: Jan. 5, 2010 by Robert Snyder et al. for a Multi-Dimensional Artifact Assemblage for Infrastructure and Other Assets With Interface Node Mediators, pp. 1-23.

Kalbacher, et al., "Development and Application of a CAD Interface for Fractured Rock," Environmental Geology, 47, Springer-Verlag, Mar. 5, 2005, pp. 1017-1027.

"AutoCAD Architecture 2008: User's Guide," Autodesk, Inc., 2007, pp. 1-2227.

European Search Report, European Application No. 11000042.9-1954/2348432, Applicant: Bentley Systems, Incorporated, Date of Mailing: May 19, 2015, pp. 1-11.

* cited by examiner

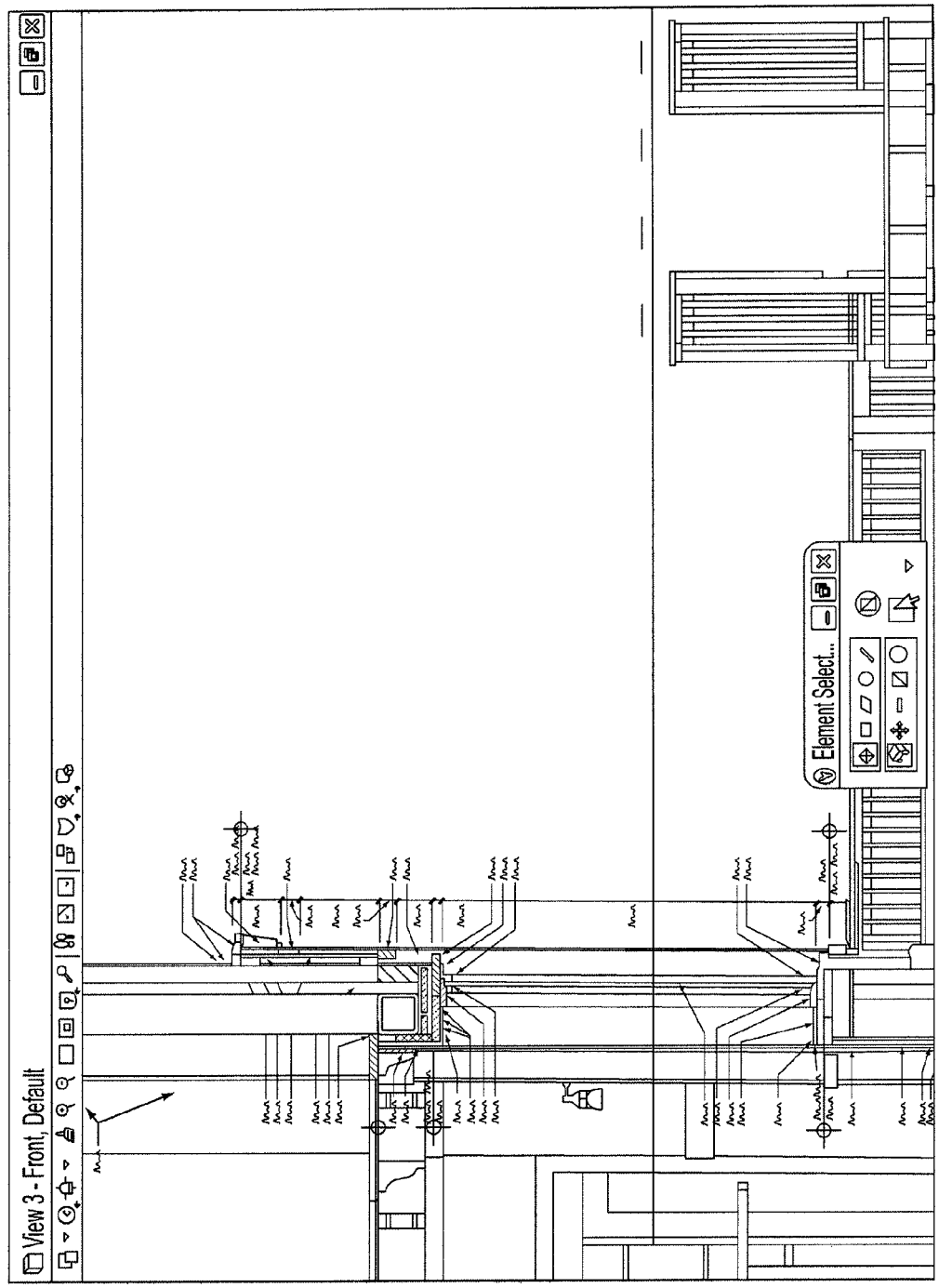

INTEGRATED ASSEMBLAGE OF 3D BUILDING MODELS AND 2D CONSTRUCTION DRAWINGS

RELATED APPLICATIONS

The present application is a continuation of U.S. patent application Ser. No. 12/652,411 by Rob Snyder et al., filed Jan. 5, 2010, entitled "Multi-Dimensional Artifact Assemblage For Infrastructure and Other Assets with Interface Node Mediators", the contents of which are incorporated by reference herein in their entirety.

BACKGROUND

Related Art

Computer Aided Design software is well-known, and used by architects, engineers, designers, planners, construction firms, and owner operators and the like to create and use precision models and technical illustrations. The software is used to create design simulations that are two-dimensional (2-D) drawings, and three-dimensional (3-D) models and related tabular and business property data. Applications such as, e.g., MicroStation®. products, including design applications spanning many infrastructure disciplines, and general purpose review applications such as (Navigator®) and construction applications such as ConstructSIM®. which are developed by Bentley Systems, Inc., Exton, Pa. U.S.A., and AutoCAD®. products, which are developed by Autodesk, Inc., San Rafael, Calif., U.S.A. are typical of such CAD software, which may be used in the Architecture, Engineering, Construction, and Operations (AECO) marketplace.

Three-dimensional (3D) assets are commonly designed, analyzed, and built, using a process in which design teams invest large amounts of time, money, and effort, creating insightful 3D digital models of those assets using design software. Design teams gain a tremendous amount of insight into projects while constructing and editing these 3D models. These 3D models are used commonly for analytical and visualization purposes, and increasingly, models are used to automate the production of conventional construction drawings.

Conventional construction drawings are 2D, flat abstractions of things. Conventional construction documentation drawings assist design professionals in explicitly defining limits of liability of the design professionals who draw them. Project designers mitigate liability a priori by selecting the locations within a project at which they intend to design, draw (automated by 3D models or not), and be held accountable.

The locations that the designers select are the locations that they draw. The selection of these locations is designated with graphical callout symbols ("callouts"). Callouts are an a priori statement of intent. These callouts are placed on various drawings, typically starting with plan drawings.

Assuming that designers abide by their professional standards of care by selecting enough locations to draw, and that these locations are sufficiently representative of the diversity of designed construction details of a project, design professionals are held accountable for the drawings that they draw, not for the ones they don't draw and that therefore do not appear on construction drawings.

Conventional construction drawings, whether their production is automated from 3D models or not, have remained essentially innovation-less for hundreds of years. Conventional drawings leave much of the insight gained during the creation of the 3D digital models behind.

Design teams that invest energy; time, effort, and money into the creation of 3D digital models desire to transfer more or all of the insight they gain while building those 3D models, to the design collaborators on their team while they work, and into the next phase of work—delivery for construction, and beyond, into asset operation, maintenance, management.

Design teams desire to provide as much useful information from their design processes as possible. The insight developed during the design of 3D models should be delivered downstream to users, like contractors, subcontractors, owners, and operators. Therefore, delivery of the 3D models, on which considerable effort has been expended, and which contain essential project insight, is desired.

However, certain factors prevent the delivery of 3D models and make such delivery, practically speaking, unachievable. A 3D model represents the full scope of a project, a whole thing, rather than a limited pre-selected set of locations within a project that are drawn. This whole 3D model may be incomplete. As much as any design team may wish to try, the 3D model may never be 100% complete throughout every cubic millimeter of the project; and far from it, in fact. 3D models are a mixture of locations that are complete and locations that may be, and may remain, incomplete. 3D models, delivered as they are today in the industry, "naked" so to speak, are completely ambiguous. No one can distinguish between the locations in 3D models that are complete and the locations that are not complete. Models are frequently discarded because of that ambiguity. No one can tell which locations in the model are complete and which locations are not complete, nor can anyone tell who claims responsibility for any particular location in a model. 3D models are an unreliable medium with which to communicate design and construction intent, as 3D models omit any device that provides clarity with regard to location-specific authorship and location-specific completeness, precisely those things that design professionals require in order to be clear and in order to mitigate risk in their professional practice. It is this deficiency of 3D models that is addressed by this invention and solved.

SUMMARY

In an exemplary embodiment a computer useable information storage medium storing computer readable program code means for causing a computer to perform the steps of: creating a 3D artifact representing an object: creating a 2D artifact defining design details of a location in the object; creating an assemblage of the 2D and 3D artifacts where the 2D artifact is linked to the location in the 3D artifact; providing an interface node in the 3D artifact at the location indicating a 2D artifact is provided; dynamically displaying the 2D artifact at the location in the 3D artifact when the interface node is selected.

BRIEF DESCRIPTION OF THE DRAWINGS

In the accompanying drawings:

FIGS. 4A and 4B depict an exemplary embodiment of another clipped and annotated 3D model;

DETAILED DESCRIPTION OF EMBODIMENTS

Figure 1:
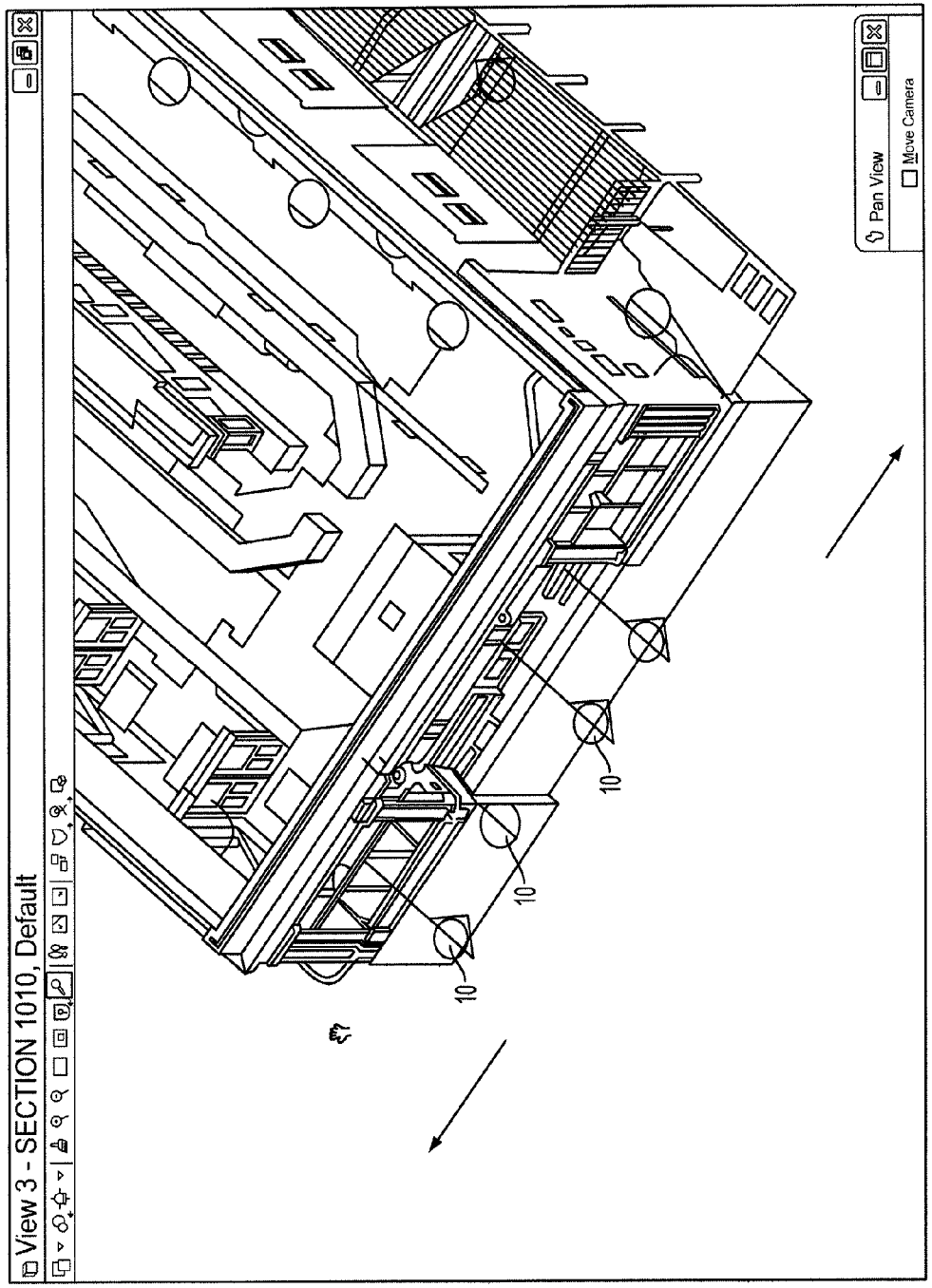
FIG. 1 depicts an exemplary embodiment of 3D model including interface nodes.

Example embodiments of the invention are discussed below in the context of CAD software. While specific example embodiments are discussed, it should be understood that this is done for illustration purposes only. The present invention may be used in any environment where disparate data is compiled and delivered.

Embodiments of the invention provide a system and method to compile different types of data from different locations into one reliable assemblage. The assemblage may include an index of information provided to a user. The assemblage may be in the form of a three dimensional (3D) representation of an object, where the 3D representation includes an index and links to more detailed information regarding the object. The 3D representation may be of any object, for example, a body part in the context of medical imaging, or a building in the context of architectural and engineering design.

The assemblage may be comprised of 3D and 2D artifacts. The 2D artifact may include 2D vector and raster embellishment in a variety of forms, such as vector graphics, raster graphics from many sources included hand drawn graphics that are scanned, specification documents, texts, cost data from cost databases, data in tabular form, notes, text, dimensions, link icons (links to other media) 602. The 3D artifact may include vector graphics (2D and 3D) including all data obtained through data conversion methods, and "Point clouds" (voxels) 600.

The combined 2D and 3D artifacts together make a whole greater than the sum of its parts 604. By bringing the 3D and 2D artifacts together in mutual context both the 3D and the 2D are richer, clearer, and easier understood than when they are separate.

When viewed, the assemblage may include interface nodes indicating those areas about which additional information is provided. The interface nodes may be graphical indicators displayed in the 3D representation 606. Selecting an interface node may result in the 3D representation being annotated and resymbolized to display the additional information. The amount of available additional information 608 that is displayed may be controlled based on user input, as is described in more detail below. The annotation and resymbolization may be performed according to rules, based on the particular type of additional information that is being displayed. For example, the scale or proportions of the 3D representation may be temporarily altered to display the additional information in-situ of the 3D representation. In an exemplary embodiment, the additional information may include a 2D artifact detailing the area of interest.

Further embodiments of the invention may provide a solution to the general issue of designer limits of liability in the context of construction deliverables. In this context, the 3D representation of the design requires a statement of intent to clarify design and constructability and to limit liability with the purposeful selection of locations in a design to draw and be held responsible for. This is the function of callouts on conventional drawings: to indicate which locations authors intend to detail and annotate and be responsible for. Embodiments of the invention may include those callouts as interface nodes within a 3D representation of the design and make the 3D representation a reliable construction deliverable by mediating the content of all deliverable construction communication and presenting it in context on demand from the interface nodes.

In the context of construction deliverables, the 3D representation may be a 3D model of a building, plant, roadway, etc. The 3D model may be viewed in a viewer. The 3D model may have interface nodes indicating detail (section, profile, detail, etc.) of the design. In the viewer, clicking on one of the interface nodes may clip the model at the interface node location and toggle on the display of any relevant additional information, including 2D and 3D artifacts like annotations. In another embodiment, an illumination meter, described below, may be provided to reveal the additional information. The illumination meter may be manipulated by a user to control the additional information displayed. The additional information may include 2D artifacts such as 2D graphic references for that location so that now a 2D drawing can be viewed in the context of the 3D model, and viewed from any viewing angle, including the viewing angle normal to the clipping location of the interface node.

Now both the 2D drawing and the 3D model may be easier to understand because they are viewed in mutual context. The capability for a user to view the combined data from any viewing angle, including the view angle normal to the clip, may be provided. When viewed at a view angle normal to the clip, the 3D model may appear as a conventional 2D drawing. At any other view angle, additional insight from the visual richness of the 3D context gives faster, deeper insight into the meaning of the drawing graphics.

In addition to providing richer, faster insight into project information, the interface nodes in the model disambiguate the 3D model. Responsibility may be claimed at the locations of the interface nodes, elsewhere is contextual background. So for the first time, those parts of the 3D model that someone has claimed responsibility for, and those parts which are uncertified and possibly incomplete, may be determined.

Turning to an exemplary embodiment of the invention, FIG. 1 illustrates an example of an assemblage including interface nodes 10. The assemblage in the disclosed embodiment includes a 3D model created using CAD software. However, the following description is equally applicable to other assemblages and interface nodes. The assemblage may also include photographs, video, medical imaging, combinations between and among the same and the like. The 3D model shown in FIG. 1 includes a plurality of interface nodes 10, in this case callouts, that are visible when the 3D model is viewed.

When an interface node is placed in the 3D model, a 2D or 3D artifact may be created and linked automatically to the 3D model at the location of the interface node. The type of 2D or 3D artifact may be selected by a user. Exemplary artifacts may include in the context of construction and design a drawing or a sheet model. Of course, other types of artifacts may be provided in different use environments. The choice of drawing or sheet model for attachment at interface node placement may extend also to the choice of either creating a new sheet/drawing model, or selecting an existing sheet or drawing. As the 3D model is being created, the option of placing an interface node at a desired location in the 3D model may be provided. A cursor may be manipulated by the user to the desired location of the interface node in the 3D model. The user may be presented with the option to place the interface node via a menu revealed by a mouse click or other action. One of the options presented in the menu may be to create a 2D or 3D artifact, for example, a new sheet or drawing, for the interface node. The location of the desired artifact is noted and the appropriate window to create the new sheet or drawing may be presented to the user. A link between the interface node drawing or sheet and the appropriate location in the 3D model is created.

An option to utilize an already existing sheet or model for the 2D artifact may also be provided. In this scenario, a listing of the existing sheets or drawings may be presented to the user. The desired sheet may be dragged onto the interface node. Once that is done, a link to the sheet is automatically created. The sheet link is stored and the artifact is placed at the desired location in the 3D model, at the interface node. In an alternative embodiment, the cursor may be placed at the desired location in the 3D model. A menu presenting the option of selecting a sheet may be shown. A desired sheet may be displayed and selected via the menu. The selected sheet is then linked to the 3D model via an interface node at the appropriate location.

In addition to allowing the placement of an interface node into a 3D model by the manual intervention of a user with the subsequent automated creation and linking of drawing and sheet artifacts, in an exemplary embodiment, interface nodes may be collected and presented in the 3D model automatically. Interface nodes may be generated at their correct locations in the 3D artifact through the recognition of their prior placement on drawings and sheets elsewhere, in other drawing and sheet files that are external to the 3D artifact. Where, through a variety of means software may recognize the relationships among different data and different files and different formats, and through one or more means of federation among these data, the creation and placement of an interface node anywhere within that collection of federated information may be automatically recognized, collected, presented, and made available for use within the 3D artifact, including those uses of interface nodes described elsewhere in this document such as: clipping the 3D artifact at the location of the interface node, attaching and displaying additional artifacts (such as 2D and 3D drawing and sheet annotations) within the context of the 3D artifact, resymbolization of the artifacts as required, as well as other special functions such as required display scale alterations, and the general interface concepts associated with the interface nodes.

One of various kinds of interface nodes is a section view interface node. The symbol for the section view may be different or the same as that for other interface nodes. In a similar manner, a plan interface node may be created and placed. The plan interface node may also include its own distinct symbol indicating that it is a plan view. Also, the interface node may store multiple views. In other contexts, many different types of data may be referenced to the 3D model.

A hierarchy of interface nodes may also be provided. For example, primary interface nodes may be top-level interface nodes placed in the 3D model that indicate major views like building sections, plans, elevations. There may also be secondary interface nodes. Secondary interface nodes may often be detail interface nodes. The ability to turn interface nodes on and off may also be provided. This may be done on a global basis. A toggle/button may be provided in a user interface for this purpose.

Secondary interface nodes may become visible when the primary interface node view is invoked if the primary interface node contains secondary interface nodes. When the selection for the display of interface nodes is toggled on to display all interface nodes—this may display only primary interface nodes. Secondary interface nodes may be seen only when the primary interface node that contains the secondary interface node is invoked.

Figure 2A:
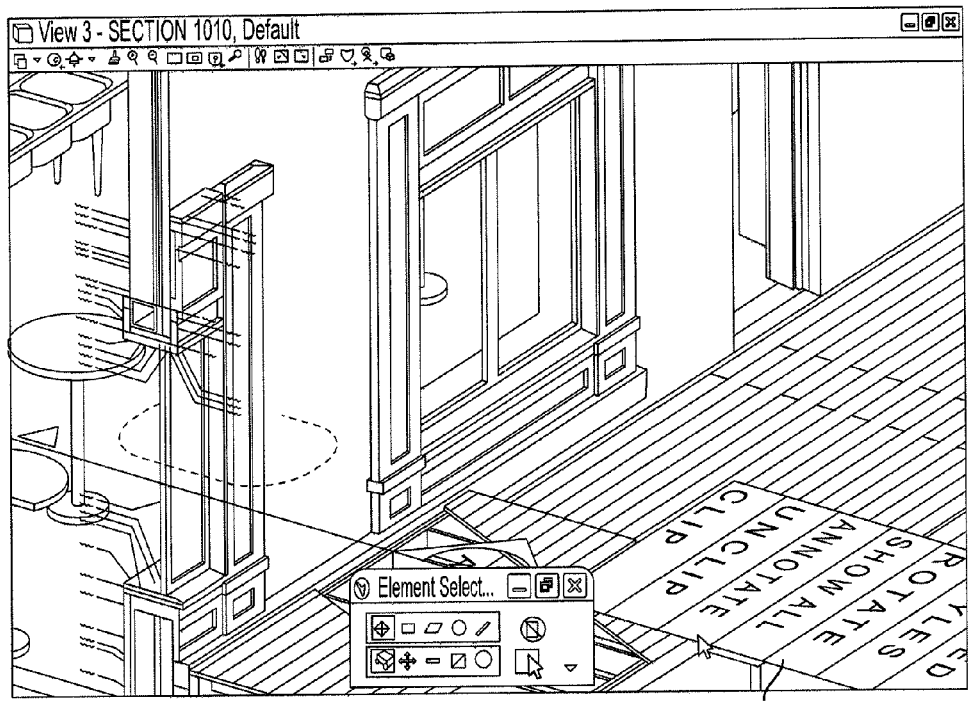
FIGS. 2A and 2B depict an exemplary embodiment of interface nodes.
Figure 2B:
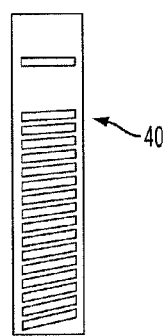

FIG. 2A illustrates an example of an interface node that is selected in a 3D model. The interface node may be selected by positioning a cursor at the interface node and a mouse click or other action to select the interface node. Visual feedback that an interface node has been selected may be provided. The interface node may be highlighted indicating that the interface node is selected. In an exemplary embodiment of the invention, as the cursor approached the interface node, an interactive dialog, such as an illumination meter, may appear. An example is shown in FIG. 2B. Additionally, in an exemplary embodiment of the invention, an indication of the boundaries of the interface node reference plane attached at that location may also be provided. This indication may be provided via a graphical indication, such as a semitransparent plane provided in the 3D model.

Once the interface node is selected, a menu 20 of available actions may be presented to the user. One of the menu options may be to clip the model at the interface node location. Another option may be to show annotation (show 2D or 3D artifacts). For example, the illumination meter 40 may be labeled "none" at the bottom, "clip" in the middle" and "annotate" at the top. A user may manipulate the illumination meter to select the desired option. This moves the state of the model from unclipped, to clipped (at the location of the interface node) to clipped and annotated (embellishing references present in-situ) at the top. The interface and the process are reversible by dragging the illumination bar back to the bottom.

Figure 3:
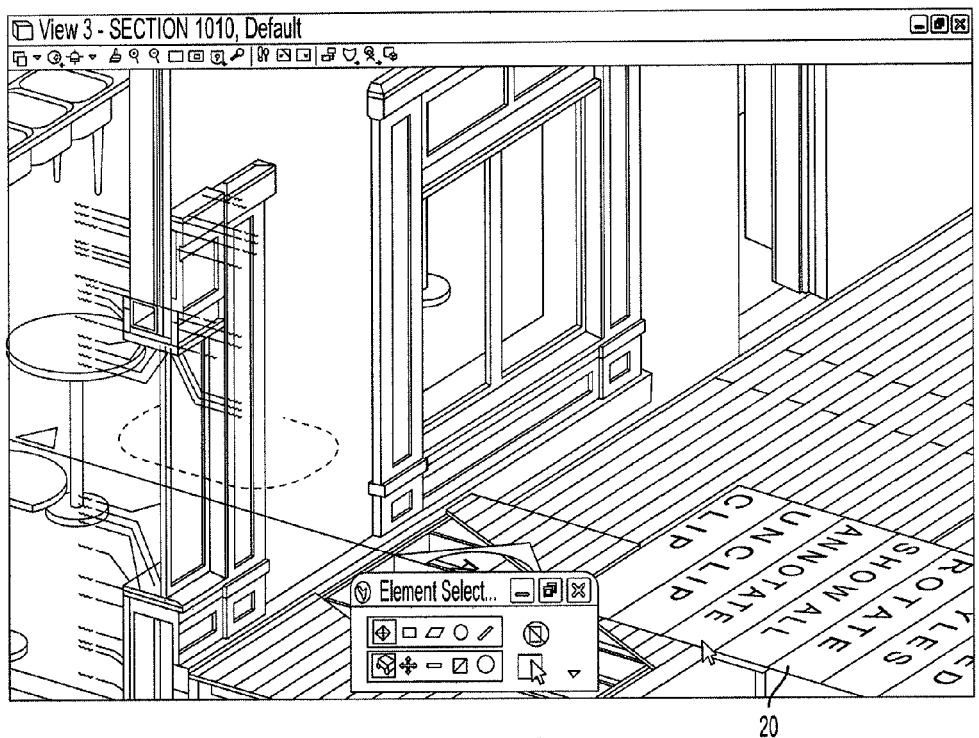
FIG. 3 depicts an exemplary embodiment of a clipped and annotated 3D model.

FIG. 3 illustrates an example of the resultant clipped and annotated 3D model. The information from the 2D artifact is displayed directly in the 3D model. However, the 3D model is not simply sliced at the location of the interface node and the additional information superimposed on the 3D model. Instead, in embodiments of the invention, the 3D model is annotated and resymbolized to include the additional information. Changes may be made to both the 2D and 3D artifacts. The changes may include display clipping, graphic resymbolization, spatial scale distortion, etc. For example, the 3D model may be resymbolized to include hatching, patterning, color, line weight, line style and the like.

Figure 4B:
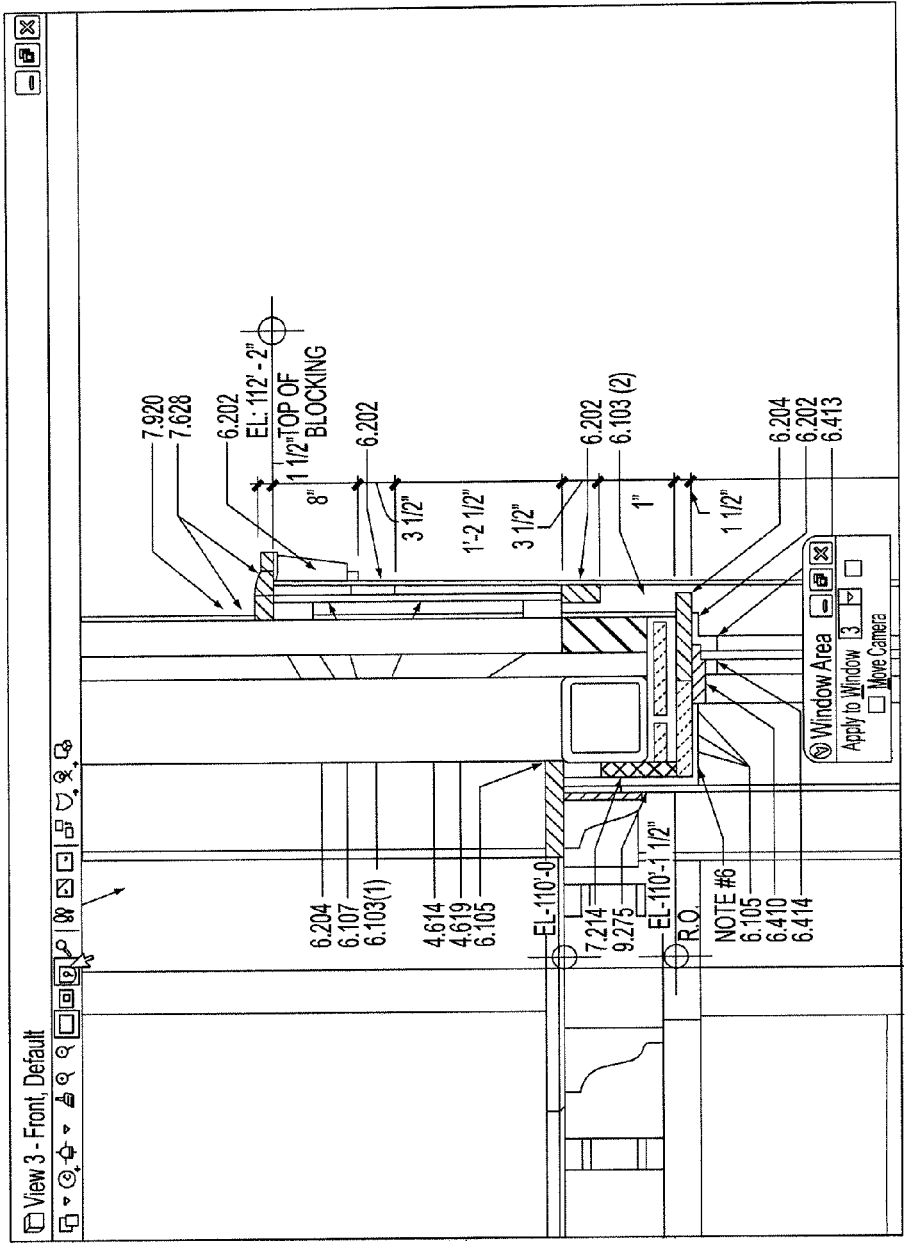

Additionally, the viewing angle may be changed so that a user can view the assemblage from any angle. A straight on view, that is, a view that is normal to the angle of clipping, of the clipped and annotated model has the essential appearance of a conventional 2D sheet drawing view, for example as is shown in FIG. 4A. FIG. 4B illustrates a zoomed in view of FIG. 4A

A rotation tool may be provided to change the viewing angle in order to gain more insight from the assemblage. A shortcut may be provided to take the user to the normal viewing angle for the drawing.

In addition to viewing the drawing/sheet model (2D or 3D artifacts) in-situ in the context of the clipped 3D design model, the interface nodes may also have a menu item to open the relevant drawing/sheet model, the ones associated with the interface node. Cross referencing in both directions, sheet/drawing into 3D model, and 3D model into sheet/drawing, maintains correct positioning and alignment.

In a further embodiment, the authorship or ownership of an interface node may also be indicated. Users may apply their registration seal and/or signature to an interface node to claim responsibility for the design information provided at the location of the interface node. The use of different "master models", one for each discipline, may be provided for this purpose. On a project, structural users, and mechanical users, and architectural users (for example) each may control their own master files and their own interface nodes. These files may be referenced together as needed. This kind of domain separation may also be preserved even when all references are published.

Examples of Ownership properties may include:
Source application (Architecture, Structural, Mechanical . . . )
Firm name (business name) of authoring consultant firm
Design Professional's name
Interface node display per ownership criteria The display of interface nodes may be controlled in such a way that a user can display selection sets of interface nodes according to interface node ownership properties. Since interface nodes owned by more than one source may often be displayed at once, a graphical indication of ownership may be shown. In an exemplary embodiment, a different interface node style may be defined for each owner—for example, mechanical interface nodes might be green in color and structural interface nodes may be red.

Figure 5:
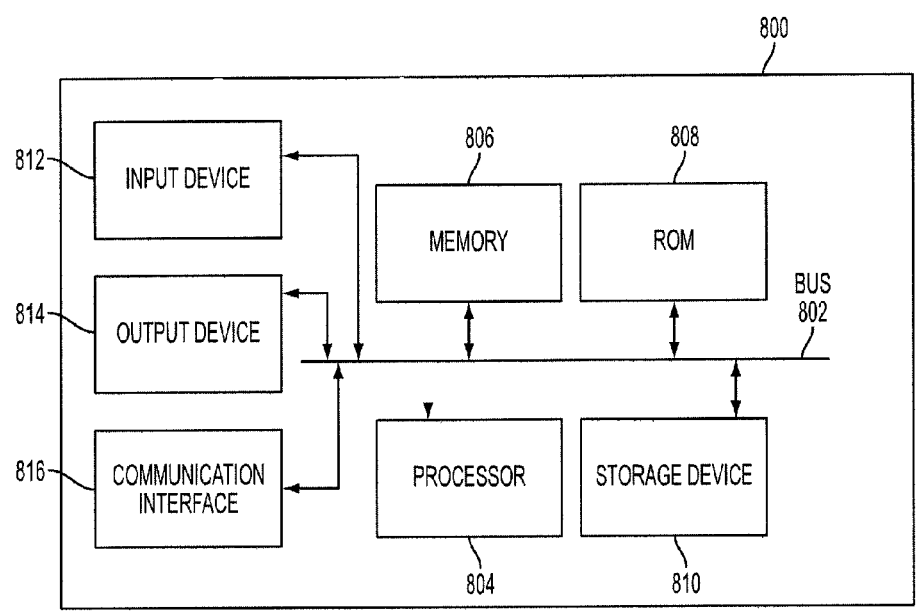
FIG. 5 depicts an exemplary embodiment of a computer system.
Figure 6:
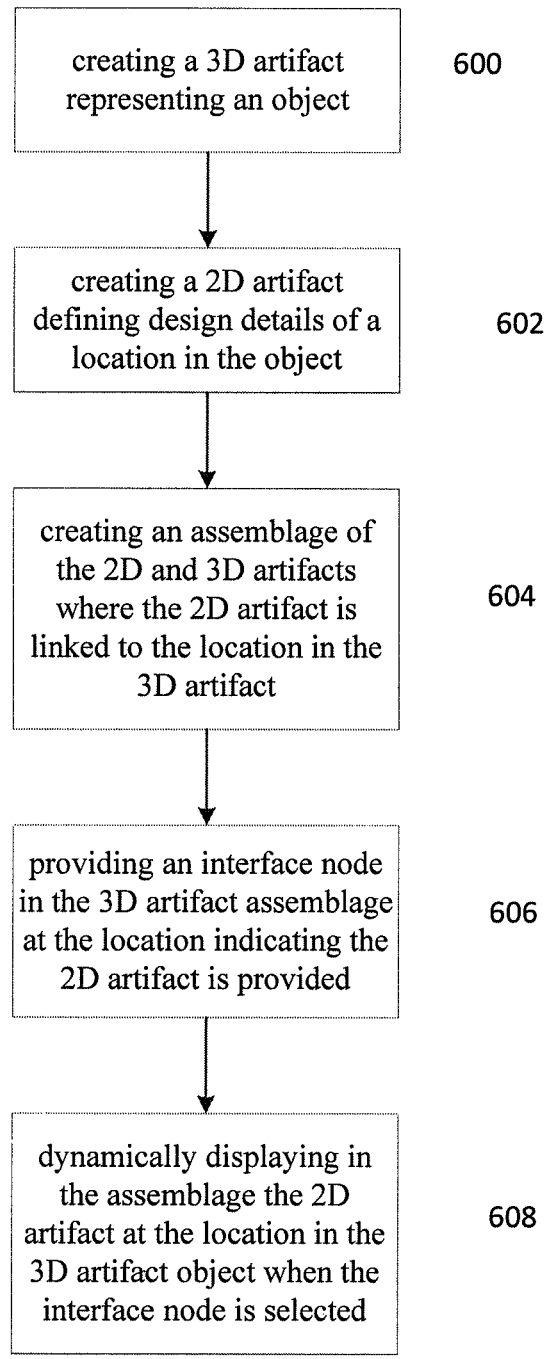
FIG. 6 depicts a flow chart of a process according to an exemplary embodiment.

FIG. 5 depicts an exemplary block diagram of a computer system 800 that may be configured to execute the functions described herein. Computer system 800 may include one or more components that may include a bus 802, a processor 804, a memory 806, a read only memory (ROM) 808, a storage device 810, an input device 812, an output device 814, and a communication interface 816.

Bus 802 may include one or more interconnects that permit communication among the components of computer system 800, such as processor 804, memory 806, ROM 808, storage device 810, input device 812, output device 814, and communication interface 816.

Processor 804 may include any type of processor, microprocessor, or processing logic that may interpret and execute instructions (e.g., a field programmable gate array (FPGA)). Processor 804 may comprise a single device (e.g., a single core) and/or a group of devices (e.g., multi-core). The processor 804 may include logic configured to execute computer-executable instructions configured to implement one or more embodiments. The instructions may reside in the memory 806 or ROM 808.

Memory 806 may be a computer-readable medium that may be configured to store instructions configured to implement one or more embodiments. The memory 806 may be a primary storage accessible to the processor 804 and may comprise a random-access memory (RAM) that may include RAM devices, such as Dynamic RAM (DRAM) devices, flash memory devices, Static RAM (SRAM) devices, etc.

ROM 808 may include a non-volatile storage that may store information and computer-executable instructions for processor 804. The computer-executable instructions may include instructions executed by processor 804.

Storage device 810 may be configured to store information and instructions for processor 804. Examples of storage device 810 may include a magnetic disk, optical disk, flash drive, etc. The information and computer-executable instructions and information may be stored on a medium contained in the storage device 810. Examples of media may include a magnetic disk, optical disk, flash memory, etc. Storage device 810 may include a single storage device or multiple storage devices. Moreover, storage device 810 may attach directly to computer system 800 and/or may be remote with respect to computer system 800 and connected thereto via a network and/or another type of connection, such as a dedicated link or channel.

Input device 812 may include any mechanism or combination of mechanisms that may permit information to be input into computer system 800 from, e.g., a user. Input device 812 may include logic configured to receive information for computer system 800 from, e.g. a user. Examples of input device 812 may include a keyboard, mouse, touch sensitive display device, microphone, pen-based pointing device, and/or biometric input device, etc.

Output device 814 may include any mechanism or combination of mechanisms that may output information from computer system 800. Output device 814 may include logic configured to output information from computer system 800. Embodiments of output device 814 may include displays, printers, speakers, cathode ray tubes (CRTs), plasma displays, light-emitting diode (LED) displays, liquid crystal displays (LCDs), printers, vacuum florescent displays (VFDs), surface-conduction electron-emitter displays (SEDs), field emission displays (FEDs), etc.

Communication interface 816 may include logic configured to interface computer system 800 with network 1406 and enable computer system 800 to exchange information with other entities connected to network 1406, such as, for example, service provider 1410, target environment 1404 and cluster 1408. Communication interface 816 may include any transceiver-like mechanism that enables computer system 800 to communicate with other devices and/or systems, such as a client, a server, a license manager, a vendor, etc. The communications may occur over a communication medium, such as a data network. Communication interface 816 may include one or more interfaces that are connected to the communication medium. The communication medium may be wired or wireless. Communication interface 816 may be implemented as a built-in network adapter, network interface card (NIC), Personal Computer Memory Card International Association (PCMCIA) network card, card bus network adapter, wireless network adapter, Universal Serial Bus (USB) network adapter, modem or any other device suitable for interfacing computer system 800 to any type of network.

It should be noted that embodiments may be implemented using some combination of hardware and/or software. It should be further noted that a computer-readable medium that comprises computer-executable instructions for execution in a processor may be configured to store various embodiments. The computer-readable medium may include volatile memories, non-volatile memories, flash memories, removable discs, non-removable discs and so on. In addition, it should be noted that various electromagnetic signals such as wireless signals, electrical signals carried over a wire, optical signals carried over optical fiber and the like may be encoded to carry computer-executable instructions and/or computer data that embodiments of the invention on e.g., a communication network.

Embodiments may be embodied in many different ways as a software component. For example, it may be a stand-alone software package, or it may be a software package incorporated as a "tool" in a larger software product, such as, for example, a scientific modeling product. It may be downloadable from a network, for example, a website, as a stand-alone product or as an add-in package for installation in an existing software application. It may also be available as a client-server software application, or as a web-enabled software application.

While various embodiments of the present invention have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A method comprising:
displaying a three-dimensional (3D) model of a building created using computer aided design (CAD) software in a viewer executing on an electronic device having a touch sensitive display;
providing a plurality of selectable interface nodes visible at respective locations within the 3D model displayed in the viewer, each interface node linked to one or more corresponding two-dimensional (2D) construction drawings that show a section view, a plan view, an elevation view or a detail view of the building related to the location of the interface node;
receiving a selection from a user upon a particular interface node within the 3D model via the touch sensitive display;
in response to selection upon the particular interface node, displaying a menu with one or more selectable menu options in the viewer;
receiving an additional selection from the user upon a particular menu option via the touch sensitive display; and
in response to the selection upon the particular interface node and the additional selection of the particular menu option, displaying a corresponding 2D construction drawing for the particular interface node in context of the 3D model of the building.

2. The method of claim 1, wherein the displaying the corresponding 2D drawing for the particular interface node further comprises:
modifying the 3D model of the building to accommodate the corresponding 2D construction drawing for the particular interface node.

3. The method of claim 1, wherein the displaying the corresponding 2D drawing for the particular interface node further comprises:
clipping the 3D model of the building at the respective location of the particular interface node to produce a clipped 3D model of the building; and
showing the corresponding 2D construction drawing for the particular interface node in-situ in the clipped 3D model of the building.

4. The method of claim 1, wherein the displaying the corresponding 2D drawing for the particular interface node further comprises:
showing the corresponding 2D construction drawing for the particular interface node superimposed upon the 3D model of the building.

5. The method of claim 1, wherein the displaying the 3D model of the building displays the 3D model of the building from a viewing angle, and the method further comprises:
after displaying the corresponding 2D construction drawing for the particular interface node, changing the viewing angle to show the 3D model of the building and the corresponding 2D construction drawing from another angle.

6. The method of claim 1, wherein one or more of the plurality of interface nodes are linked to multiple corresponding 2D construction drawings.

7. The method of claim 1, further comprising:
providing visual feedback acknowledging the selection upon the particular interface node.

8. The method of claim 1, wherein the corresponding 2D construction drawing for the particular interface node is a section view of the building.

9. The method of claim 1, wherein the corresponding 2D construction drawing for the particular interface node is a plan view of the building.

10. The method of claim 1, wherein the corresponding 2D construction drawing for the particular interface node is an elevation view of the building.

11. The method of claim 1, wherein the corresponding 2D construction drawing depicts a section, plan, elevation or detail view from a viewing angle other than a viewing angle of the 3D model of the building.

12. A method comprising:
displaying a three-dimensional (3D) model of a building created using computer aided design (CAD) software in a viewer executing on an electronic device having a touch sensitive display;
providing a plurality of selectable interface nodes visible at respective locations within the 3D model displayed in the viewer, each interface node linked to one or more corresponding two-dimensional (2D) construction drawings that show a section view, a plan view, an elevation view or a detail view of the building;
receiving a selection from a user upon a particular interface node within the 3D model via the touch sensitive display;
in response to the selection upon the particular interface node, displaying a menu with one or more selectable menu options;
receiving an additional selection from the user upon a particular menu option via the touch sensitive display; and
in response to selection of the particular menu option,
clipping the 3D model of the building at the respective location of the particular interface node to produce a clipped 3D model of the building, and
displaying a corresponding 2D construction drawing for the particular interface node in-situ in the clipped 3D model of the building.

13. The method of claim 12, wherein the displaying the 3D model of the building displays the 3D model of the building from a viewing angle, and the method further comprises:
after displaying the corresponding 2D construction drawing for the particular interface node, changing the viewing angle to show the 3D model of the building and the 2D construction drawing from another angle.

14. The method of claim 12, wherein one or more of the plurality of interface nodes are linked to multiple corresponding 2D construction drawings.

15. The method of claim 12, further comprising:
providing visual feedback acknowledging the selection upon the particular interface node.

16. An electronic device comprising:
a touch sensitive display;
a wireless network adaptor configured to communicate with a communication network;
a memory configured to store a software component; and
a processor configured to execute the software component, wherein the software component, when executed by the processor, is operable to:
display a three-dimensional (3D) model of a building on the touch sensitive display;
provide a plurality of selectable interface nodes visible at respective locations within the displayed 3D model, each interface node linked to one or more corresponding two-dimensional (2D) construction drawings that show a section view, a plan view, an elevation view or a detail view of the building related to the location of the interface node;

receive a selection from a user upon a particular interface node within the 3D model via the touch sensitive display; and in response to the selection upon the particular interface node, display a corresponding 2D drawing for particular interface node in context of the 3D model on the touch sensitive display.

17. The electronic device of 16 wherein the software component, when executed by the processor, is further operable to modify the 3D model of the building to accommodate the 2D construction drawing for the particular interface node.

18. The electronic device of 16 wherein the software component, when executed by the processor, is further operable to show the 2D construction drawing for the particular interface node superimposed upon the 3D model of the building.

19. A non-transitory computer readable medium encoded with executable instructions that, when executed on a processor, are operable to:

display a three-dimensional (3D) model of a building created using computer aided design (CAD) software on an electronic device having a touch sensitive display;

provide a selectable interface node visible at a respective location within the 3D model of the building, the interface node linked to at least one corresponding two-dimensional (2D) construction drawing that shows a section view, a plan view or an elevation view of the building;

receive a selection from a user upon a particular interface node within the 3D model via the touch sensitive display; and in response to the selection upon the interface node,
clip the 3D model of the building at the respective location of the interface node to produce a clipped 3D model of the building, and display a corresponding 2D construction drawing for the interface node in context of the clipped 3D model.

20. The non-transitory computer readable medium of claim 19, further comprising instructions that, when executed, are operable to:

modify the 3D model of the building to accommodate the 2D construction drawing for the interface node.

21. The non-transitory computer readable medium of claim 19, further comprising instructions that, when executed, are operable to:

show the corresponding 2D construction drawing for the interface node in-situ in the clipped 3D model of the building.

22. The non-transitory computer readable medium of claim 19, further comprising instructions that, when executed, are operable to:

show the 2D construction drawing for the interface node superimposed upon the 3D model of the building.

23. The non-transitory computer readable medium of claim 19, further comprising instructions that, when executed, are operable to:

after display of the corresponding 2D construction drawing for the interface node, change a viewing angle to show the 3D model of the building and the 2D construction drawing from another angle.

24. The non-transitory computer readable medium of claim 19, wherein the interface node is linked to multiple corresponding 2D construction drawings.

25. The non-transitory computer readable medium of claim 19, further comprising instructions that, when executed, are operable to:

provide visual feedback acknowledging the selection upon the interface node.

\* \* \* \* \*